United States Patent
Yoon et al.

(10) Patent No.: US 7,202,011 B2
(45) Date of Patent: Apr. 10, 2007

(54) PHOTOSENSITIVE POLYMER INCLUDING FLUORINE AND RESIST COMPOSITION CONTAINING THE SAME

(75) Inventors: Kwang-Sub Yoon, Seoul (KR); Sang-Gyun Woo, Yongin (KR); Ki-Yong Song, Seoul (KR); Sang-jun Choi, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 347 days.

(21) Appl. No.: 10/423,945

(22) Filed: Apr. 28, 2003

(65) Prior Publication Data

US 2003/0228537 A1   Dec. 11, 2003

(30) Foreign Application Priority Data

May 28, 2002   (KR) ............... 10-2002-0029607

(51) Int. Cl.
  G03C 1/73 (2006.01)
  G03F 7/038 (2006.01)
  G03F 7/039 (2006.01)
  G03F 7/20 (2006.01)
  G03F 7/30 (2006.01)
  C08F 16/24 (2006.01)

(52) U.S. Cl. ............... 430/270.1; 430/907; 430/325; 430/326; 430/311; 430/327; 430/330; 430/921; 430/925; 526/242; 526/247

(58) Field of Classification Search ............ 430/270.1, 430/907, 909, 910, 914, 921, 925, 311, 326, 430/330; 526/247
See application file for complete search history.

(56) References Cited

U.S. PATENT DOCUMENTS 6,461,789 B1 * 10/2002 Hatakeyama et al. .... 430/270.1
6,723,488 B2 *  4/2004 Kudo et al. .............. 430/270.1

OTHER PUBLICATIONS

Song et al, "Fluorocarbon Based Single-layer Resist for 157 nm Lithography", Proceedings of SPIE, vol. 4690 (Mar. 2002), p. 504-511.*

* cited by examiner

*Primary Examiner*—Sin Lee
(74) *Attorney, Agent, or Firm*—Harness, Dickey & Pierce, P.L.C.

(57) ABSTRACT

Disclosed is a photosensitive polymer comprising pentafluoromethylvinyl ether derivative monomer having the formula:

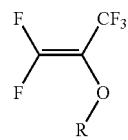

wherein R may be an alkoxy carbonyl, alkylsilane, a fluorine-substituted or unsubstituted $C_3$–$C_{20}$ alkyl carbonyl, a fluorine-substituted or unsubstituted $C_3$–$C_{20}$ cycloalkylcarbonyl or a fluorine-substituted or unsubstituted benzoyl substituent group. The photosensitive polymer is the polymerization product of the pentafluoromethylvinyl ether derivative monomer and at least one additional monomer selected from the group consisting of (meth)acrylic acid, (meth)acrylate, styrene, norbornene, tetrafluoroethylene and maleic anhydride monomers. The photosensitive polymer may be used in photoresist compositions for exposure light sources having a predominant wavelength of less than 157 nm.

22 Claims, No Drawings

PHOTOSENSITIVE POLYMER INCLUDING FLUORINE AND RESIST COMPOSITION CONTAINING THE SAME

CROSS-REFERENCE TO RELATED APPLICATION

This application claims priority to Korean Patent Application No. 2002-29607, filed May 28, 2002, the contents of which are incorporated herein by reference in their entirety.

BACKGROUND OF THE INVENTION

1. Field of the Invention

The invention relates to a photosensitive polymer and a resist composition containing the polymer. More particularly, the invention relates to a fluorinated photosensitive polymer and a resist composition containing the fluorinated polymer.

2. Description of the Related Art

As the manufacture of semiconductor devices becomes more complicated and the integration density of the resulting semiconductor devices increases, there continues to be a need to form fine patterns during the manufacturing process. Furthermore, with regard to 1-Gigabit or greater capacity semiconductor memory devices, pattern imaging processes capable of resolving features for design rules of 0.2 μm or less are needed. Conventional photoresist materials exposed with a KrF excimer laser (248 nm) are limited in their ability to form such fine patterns. For this reason, developing lithography techniques have focused on using shorter wavelength exposure light sources such as an ArF excimer laser (193 nm). Although lithography techniques using an ArF excimer laser may permit patterning of 100 nm features, resolving features with more demanding size requirements will tend to require even shorter wavelength exposure light sources and new lithography techniques that can utilize such exposure sources. One such exposure source is the $F_2$ excimer laser (157 nm) which may be capable of forming 70 nm patterns, resulting in efforts to formulate suitable resist materials.

Conventional $F_2$ excimer laser resists include a copolymer of t-butyl trifluoromethylacrylate and hexafluoroisopropanol substituted styrene, represented by formula I below, or a copolymer of tetrafluoroethylene and norbornene disclosed by DuPont, represented by formula II below:

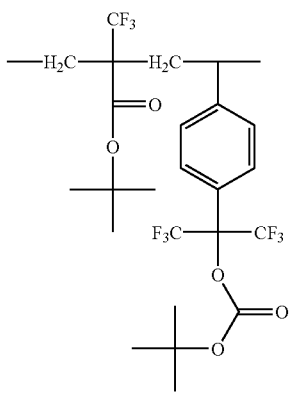

(I)

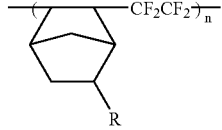

(II)

SUMMARY OF THE INVENTION

Exemplary embodiments of the invention are photosensitive polymers providing a high transmittance at a $F_2$ excimer laser wavelength (157 nm) and characteristics suitable for producing very small patterns.

Exemplary embodiments of the invention also include resist compositions containing the photosensitive polymer suitable for use with an exposure source having a wavelength of 157 nm or less. Exemplary embodiments of the invention provide high transparency at wavelengths of 157 nm or less, high resistance to dry etching, good adhesion to other materials, good contrast characteristics, are capable of being developed using conventional aqueous developing solutions and annealing effect during baking.

Exemplary embodiments of the invention include photosensitive polymers containing a pentafluoromethylvinyl ether derivative of a monomer such as a substituted alkoxy carbonyl, alkylsilane, $C_3$–$C_{20}$ alkyl carbonyl, $C_3$–$C_{20}$ cycloalkylcarbonyl or benzoyl in which the substituent may be fluorine.

Exemplary embodiments of the invention include photosensitive polymers that are the polymerization product of at least one monomer selected from the group of monomers consisting of (meth)acrylic acid, (meth)acrylate, styrene, norbornenes, tetrafluoroethylene, maleic anhydride, and pentafluoromethylvinyl ether derivatives in which fluorine is present as a substituent. The weight average molecular weight of these photosensitive polymers is between about 3,000 and 100,000.

Exemplary embodiments of the invention include photoresist compositions prepared from at least one polymer selected from the photosensitive polymers and approximately 1 to 15 wt % of at least one photoacid generator (PAG) based on the weight of the photosensitive polymer. The PAG component of the resist compositions may be selected from triarylsulfonium salts, diaryliodonium salts, sulfonates or N-hydroxysuccinimide triflates, and mixtures of these compounds. Exemplary embodiments of the resist compositions may also include an organic base of up to about 2% by weight based on the weight of the photosensitive polymer.

DETAILED DESCRIPTION OF THE INVENTION

Although exemplary embodiments of photosensitive polymers and resist compositions, as well as a photolithography process using the resist composition according to the invention, are described below, those of ordinary skill in the art will appreciate that this invention may be practiced in a variety of ways. The specific exemplary embodiments described below are provided so that this disclosure will be thorough and complete, and will fully convey the scope of the invention to those skilled in the art. In the formulas provides, the same characters are generally used to denote the same or same type of functional groups.

An exemplary photosensitive polymer according to the invention includes a pentafluoromethylvinyl ether derivative monomer represented by formula III:

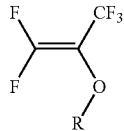

(III)

wherein R is alkoxy carbonyl, alkylsilane, fluorine-substituted or unsubstituted $C_3$–$C_{20}$ alkyl carbonyl, fluorine-substituted or unsubstituted $C_3$–$C_{20}$ cycloalkylcarbonyl or fluorine-substituted or unsubstituted benzoyl.

In the case where R is an alkoxy carbonyl, a monomer represented by formula IV may be used:

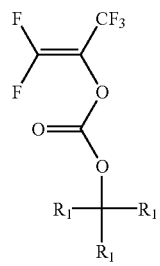

(IV)

wherein $R_1$ is is a $C_1$–$C_{20}$ alkyl that may be fluorine-substituted.

In the case where R is alkylsilane, a monomer represented by formula V may be used:

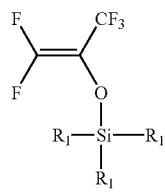

(V)

wherein $R_1$ is a $C_1$–$C_{20}$ alkyl.

In the case where R is a fluorine-substituted or unsubstituted $C_3$–$C_{20}$ cycloalkylcarbonyl, monomer represented by the formula VI may be used:

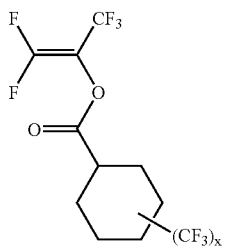

(VI)

wherein x is 0, 1, 2 or 3.

In the case where R is a fluorine-substituted or unsubstituted benzoyl, a monomer represented by the formula VII may be used:

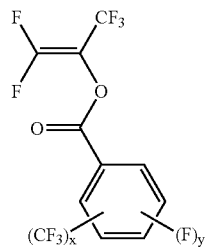

(VII)

wherein x and y are independent and may be 0, 1, 2 or 3, with x+y totaling no more than 5.

In the case where R is a fluorine-substituted $C_3$–$C_{20}$ alkylcarbonyl, a monomer represented by the formula VIII may be used:

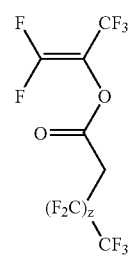

(VIII)

wherein z is an integer less than 8.

Exemplary photosensitive polymers according to the invention are the polymerization product of at least one monomer selected from the group of monomers consisting of (meth)acrylic acid, (meth)acrylate, styrene, norbornene, tetrafluoroethylene, maleic anhydride, and pentafluoromethylvinyl ether derivatives. The monomers being polymerized may include fluorine substituents that will tend to improve transmittance.

In particular, suitable monomers include trifluoromethyl acrylic acid, 2,2,2-trifluoro-1-trifluoromethyl ethyl acrylate, t-butyl trifluoromethyl acrylate, hexafluoro iosopropanol substituted styrene, and 3-norbornylmethyl-2-t-butyloxycarbonyloxy-1,1,1-trifluoro-2-trifluoromethylpropane represented by following formulas IX-XIII, respectively:

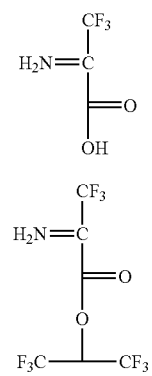

(IX)

(X)

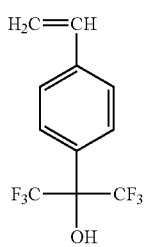

(XI)

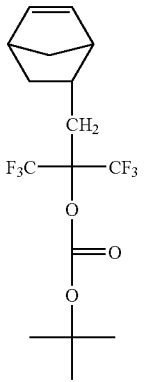

(XII)

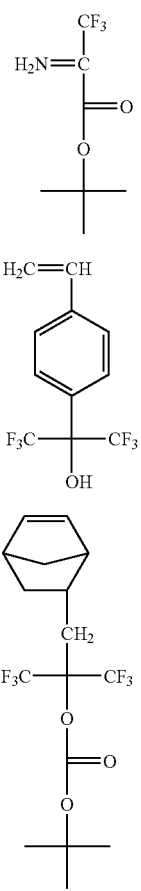

(XIII)

Exemplary photosensitive polymers according to the invention may be produced by known radical polymerization processes, e.g., bulk polymerization or solution polymerization. As the polymerization initiator, general radical initiators, such as azobisisobutyronitrile (AIBN) may be used. During solution polymerization, a solvent such as tetrahydorfuran (THF), dioxane, ethylacetate, dichloromethane or cyclohexane may be used. The relative amount of each monomer included in the polymer may be adjusted according to required characteristics of the resist that will incorporate that particular polymer.

To prepare resist compositions according to exemplary embodiments of the invention, one or more of the photosensitive polymers synthesized as indicated above are dissolved in a solvent such as propylene glycol monomethyl ether acetate (PGMEA), ethyl lactate or cyclohexanone with one or more photoacid generator (PAG) compositions.

A PAG is typically included in the resist composition in an amount of 1 to 15% by weight based on the weight of the photosensitive polymer. Suitable PAGs include triarylsulfonium salts, diaryliodonium salts, sulfonate, or mixtures thereof, such as triphenylsulfonium triflate, triphenylsulfonium antimonate, diphenylionium triflate, diphenyliodonium antimonate, methoxydiphenyliodonium triflate, di-t-butyldiphenyliodonium triflate, 2,6-dinitrobenzyl sulfonates, pyrogallol tris(alkylsulfonates), N-hydroxysuccinimide triflate, norbornene-dicarboximide-triflate, triphenylsulfonium nonaflate, diphenyliodonium nonaflate, methoxydiphenyliodonium nonaflate, di-t-butyldiphenyliodonium nonaflate, N-hydroxysuccinimide nonaflate, norbornene-dicarboximide-nonaflate, triphenylsulfonium perfluorooctanesulfonate (PFOS), diphenyliodonium PFOS, methoxydiphenyliodonium PFOS, N-hydroxysuccinimide PFOS, norbornene-dicarboximide PFOS or mixtures of these compounds.

The resist composition according to an exemplary embodiment of the invention may also include an organic base in an amount of 0.01 to 2.0% by weight based on the weight of the photosensitive polymer. The organic base may include an amine such as triethylamine, triisobutylamine, triisooctylamine, triisodecylamine, diethanolamine, triethanolamine or mixtures of these compounds. The inclusion of an organic base may reduce pattern deformation resulting from unexpected acidolysis caused by the acid generated within the exposed regions that then diffuses into the adjacent unexposed regions after exposure.

Exemplary embodiments of the resist compositions according to the invention may also include 30 to 200 ppm of an organic or base surfactant to improve the ability of the resist composition to be uniformly coated on a substrate. To adjust the overall dissolution speed of the resist, the resist compositions may also include 5 to 25% by weight of a dissolution inhibitor, based on the weight of the photosensitive polymer.

Before being used in a lithography process, the resist solution is typically first filtered twice using a 0.2 µm membrane filter to remove residual particles. The filtered resist composition may then be used to produce a pattern on a substrate such as a wafer.

A wafer may be coated with the resist composition to form a resist layer having a thickness, typically between about 0.05 and 0.5 µm. The wafer having the resist layer may then be pre-baked at a temperature in the range of 80 to 150° C. for approximately 30 to 300 seconds, followed by exposure using an exposure light source having a wavelength of 193 nm or less, preferably using a $F_2$ excimer laser (157 nm). Acid ($H^+$) is generated from the PAG(s) contained within the resist layer by the light exposure.

After exposure, a post-exposure baking (PEB) may be performed to promote acidolysis in the exposed portions of the resist layer in the presence of a catalyst, i.e., the acid generated within the exposed portion, thereby forming a large number of hydrophilic groups in the exposed portions of the resist layer. The PEB should be conducted at a temperature below both the glass transition temperature $T_g$ and the decomposition temperature $T_d$ of the polymer. This process produces a noticeable difference in polarity between the exposed portions and non-exposed portions of the resist layer. The exposed photoresist layer may then be developed using an aqueous developing solution to form a photoresist pattern having a good pattern profile and high resolution. An aqueous solution of 2.38 wt % tetramethylammonium hydroxide (TMAH) may be used to develop such a resist layer.

The photoresist pattern may then be used as an implant or etching mask to selectively dope regions of the substrate or form a pattern in one or more layers underlying the photoresist pattern by removing the exposed portions of the layer(s).

Exemplary embodiments of the invention will be described in detail with reference to the following examples and synthesis examples that will enable one of skill in the art to understand the scope of the invention. It is noted that reagents used in the following examples are generally available commercially, and most are available from Aldrich Chemical Co.

Synthesis of Monomer

SYNTHESIS EXAMPLE 1

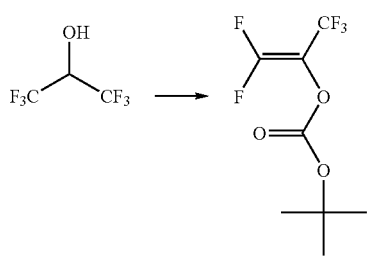

To a solution of 50 g of hexafluoroisopropyl alcohol dissolved in 350 ml dry tetrahydrofuran (THF), 2.5M n-butyl lithium (260 ml) was added dropwise at −70° C. in a stream of nitrogen over 60 minutes. The resulting solution was stirred at −70° C. for 10 minutes, and the reaction temperature was elevated using a 0° C. ice bath, followed by stirring for an additional 1 hour. A solution prepared by dissolving 98 g of di-t-butyl dicarbonate in 50 ml tetrahydropyrane was added dropwise to the resultant product over the course of about 30 minutes. The resultant product was then stirred at 0° C. for an additional 2 hours. The organic layer was then diluted with 700 ml ether and washed with 500 ml of a saturated aqueous NaCl solution. The aqueous solution layer was then separated and extracted with an additional 500 ml of ether to form a second organic layer. The collected organic layers were then dried using anhydrous magnesium sulfate (MgSO$_4$), after which the ether removed by distillation under reduced pressure. The remaining portion was then filtered using hexane and silica gel. The hexane was then removed by distillation under reduced pressure, to give pentafluoro-1-methylvinyl t-butyl carbonate with a yield of 82%.

SYNTHESIS EXAMPLE 2

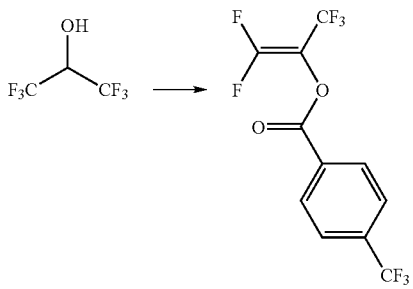

The procedure described in Synthesis Example 1 was carried out with 4-(trifluoromethyl)benzoyl chloride substituted for the di-t-butyl dicarbonate, to give 4-trifluoromethyl-benzoic acid 2,2-difluoro-1-trifluoromethyl-vinyl ester with a yield of 84%.

SYNTHESIS EXAMPLE 3

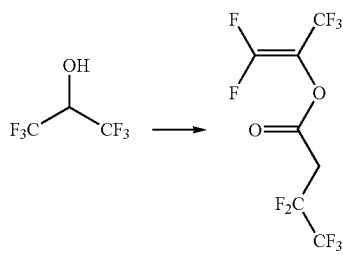

The procedure described in Synthesis Example 1 was carried out with 2,2,3,3,3-pentafluorobutyricacid chloride substituted for the di-t-butyl dicarbonate, to give 3,3,4,4,4-pentafluoro-butyric acid 2,2-difluoro-1-trifluoromethyl-vinyl ester with a yield of 79%.

SYNTHESIS EXAMPLE 4

The procedure described in Synthesis Example 1 was carried out with chlorotrimethylsilane substituted for the di-t-butyl dicarbonate, to give 2,2-(difluoro-1-trifluoro methyl-vinyloxy)-trimethyl-silane with a yield of 50%.

SYNTHESIS EXAMPLE 5

The procedure described in Synthesis Example 1 was carried out with 2,2,3,3,3-pentafluorobutyricacid chloride substituted for the di-t-butyl dicarbonate, to give 4-trifluoromethyl-cyclohexanecarboxylic acid 2,2-difluoro-1-trifluoromethylvinyl ester with a yield of 73%.

Synthesis of Photosensitive Polymer

TERPOLYMER SYNTHESIS EXAMPLE 1

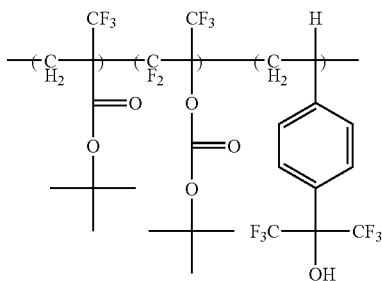

1.8 g of a 2-trifluoromethyl-acrylic acid t-butyl ester monomer; 2.3 g of the pentafluoro-1-methylvinyl t-butyl carbonate monomer synthesized in Synthesis Example 1; 2.5 g of 1,1,1-trifluoro-2-(4-vinyl-phenyl)-propan-2-ol) and 0.42 g of AIBN were reacted at 65° C. for approximately 24 hours. The resulting product was precipitated twice in excess hexane, filtered and dried in a vacuum oven for approximately 24 hours to give a terpolymer with a yield of 68%.

The weight average molecular weight and polydispersity (Mw/Mn) of the obtained terpolymer were about 45,000 and 2.5, respectively.

Additional polymers were then synthesized using different reaction solvents and the conditions used in synthesizing the terpolymer to produce the results are shown below in Table 1.

TABLE 1

| Solvent (Solvent/Monomer, wt %) | Polymerization time | Yield | Mw | Mw/Mn |
|---|---|---|---|---|
| Ethylacetate (0.5) | 20 | 59 | 19,300 | 1.7 |
| Ethylacetate (1.0) | 20 | 48 | 16,300 | 1.7 |
| Dichloromethane (1.0) | 20 | 63 | 26,600 | 1.5 |

TERPOLYMER SYNTHESIS EXAMPLE 2

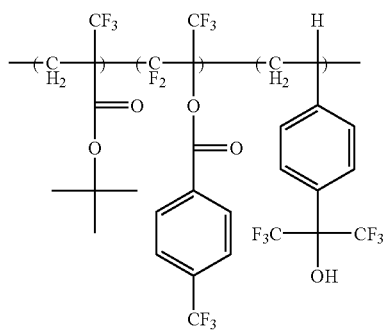

The procedure used in Terpolymer Synthesis Example 1 was carried out with 3.0 g of the 4-trifluoromethyl-benzoic acid 2,2-difluoro-1-trifluoromethyl-vinyl ester monomer synthesized in Synthesis Example 2 substituted for the pentafluoro-1-methylvinyl t-butyl carbonate monomer, to give a terpolymer with a yield of 71%.

The weight average molecular weight and polydispersity (Mw/Mn) of the terpolyer obtained were about 22,000 and 1.9, respectively.

TERPOLYMER SYNTHESIS EXAMPLE 3

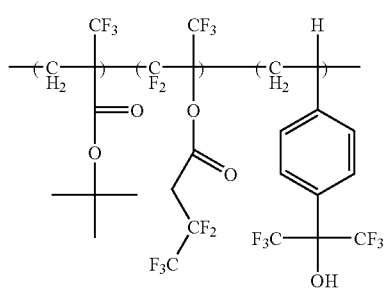

The procedure described in Terpolymer Synthesis Example 1 was carried out with 2.9 g of the 3,3,4,4,4-pentafluoro-butyric acid 2,2-difluoro-1-trifluoromethyl-vinyl ester monomer synthesized in Synthesis Example 3 substituted for the pentafluoro-1-methylvinyl t-butyl carbonate, to give a terpolymer with a yield of 65%.

The weight average molecular weight and polydispersity (Mw/Mn) of the terpolymer obtained were about 22,000 and 1.8, respectively.

TERPOLYMER SYNTHESIS EXAMPLE 4

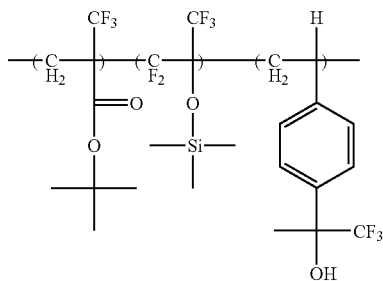

The procedure described in Terpolymer Synthesis Example 1 was carried out with 1.8 g of the 2,2-(difluoro-1-trifluoro methyl-vinyloxy)-trimethyl-silane monomer synthesized in Synthesis Example 4 substituted for the pentafluoro-1-methylvinyl t-butyl carbonate, to give a terpolymer with a yield of 65%.

The weight average molecular weight and polydispersity (Mw/Mn) of the terpolymer obtained were about 26,000 and 1.9, respectively.

TERPOLYMER SYNTHESIS EXAMPLE 5

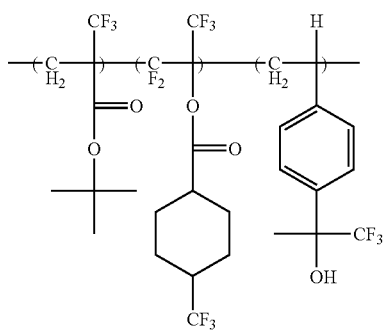

The procedure described in Terpolymer Synthesis Example 1 was carried out with 3.0 g of the 4-trifluoromethyl-cyclohexanecarboxylic acid 2,2-difluoro-1-trifluoromethylvinyl ester monomer synthesized in Synthesis Example 5 substituted for the pentafluoro-1-methylvinyl t-butyl carbonate, to give a terpolymer with a yield of 65%.

The weight average molecular weight and polydispersity (Mw/Mn) of the terpolymer obtained were about 28,000 and 2.3, respectively.

Synthesis of Tetrapolymer

TETRAPOLYMER SYNTHESIS EXAMPLE 1

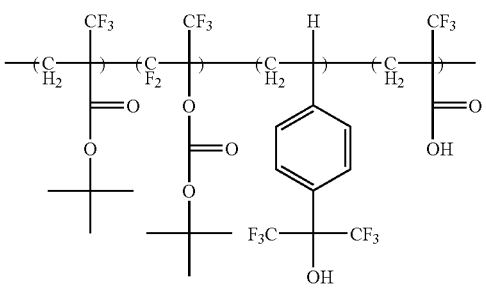

1.8 g of 2-trifluoromethyl-acetic acid t-butyl ester; 2.3 g of pentafluoro-1-methylvinyl t-butyl carbonate; 2.5 g of 1,1,1-trifluoro-2-(4-vinyl-phenyl)-propan-2-ol; 1.5 g of trifluoromethyl acrylic acid and 0.42 g of AIBN were degassed with 7 g of ethylacetate, and reacted at 65° C. for approximately 24 hours. The resulting product was precipitated twice in excess hexane, filtered and dried at a vacuum oven for approximately 24 hours, to give a tetrapolymer with a yield of 45%.

The weight average molecular weight and polydispersity (Mw/Mn) of the tetrapolymer obtained were about 25,000 and 1.7, respectively.

TETRAPOLYMER SYNTHESIS EXAMPLE 2

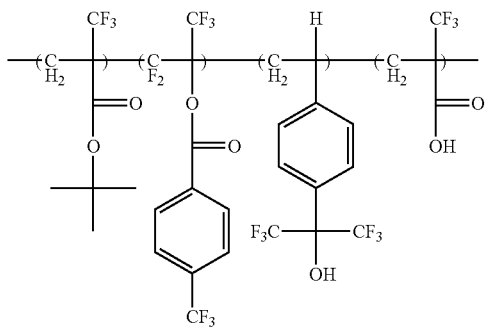

The procedure was carried out as in tetrapolymer Synthesis Example 1 was carried out with 3.0 g of 4-trifluoromethyl-benzoic acid 2,2-difluoro-1-trifluoromethyl-vinyl ester substituted for the pentafluoro-1-methylvinyl t-butyl carbonate, to give a tetrapolymer with a yield of 58%.

The weight average molecular weight and polydispersity (Mw/Mn) of the tetrapolymer obtained were about 23,000 and 1.8, respectively.

TETRAPOLYMER SYNTHESIS EXAMPLE 3

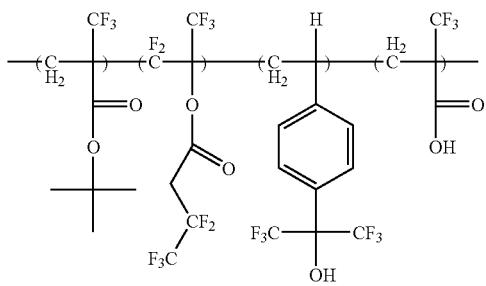

The procedure described in Tetrapolymer Synthesis Example 1 was carried out with 2.9 g of 3,3,4,4,4-pentafluoro-butyric acid 2,2-difluoro-1-trifluoromethyl-vinyl ester substituted for the pentafluoro-1-methylvinyl t-butyl carbonate, to give a tetrapolymer with a yield of 69%.

The weight average molecular weight and polydispersity (Mw/Mn) of the tetrapolymer obtained were about 27,000 and 1.9, respectively.

TETRAPOLYMER SYNTHESIS EXAMPLE 4

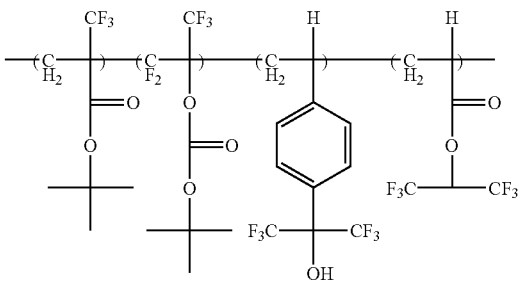

1.3 g of 2-trifluoromethyl-acetic acid t-butyl ester; 1.6 g of pentafluoro-1-methylvinyl t-butyl carbonate; 1.8 g of 1,1,1-trifluoro-2-(4-vinyl-phenyl)-propan-2-ol; 0.5 g of acrylate 2,2,2-trifluoro-1-trifluoromethyl-ethyl ester and 0.31 g of AIBN were degassed with 4 g of ethylacetate. Thereafter, the procedure described in Tetrapolymer Synthesis Example 1 was carried out to give a tetrapolymer with a yield of 45%.

The weight average molecular weight and polydispersity (Mw/Mn) of the tetrapolymer obtained were about 21,000 and 1.7, respectively.

Preparation of Resist Composition and Photolithography Process Using the Same 1.0 g of each of the polymers synthesized in the above described Synthesis Examples and 0.05 g of triphenylsulfonium trifluoromethane (triflate) as a photoacid generator (PAG) were dissolved in 15 g of a cyclohexanone. 5 mg of triisodecylamine as an organic base was added to the solution for complete dissolution, followed by filtering using a 0.2 μm membrane filter to produce a series of exemplary resist compositions. Silicon (Si) wafers treated with an anti-reflective coating were then coated with the resist compositions to a thickness of approximately 0.15 μm.

Thereafter, the coated wafers were soft-baked at a temperature of 100 to 140° C. for approximately 60 seconds, and exposed using a $F_2$ excimer laser stepper (NA=0.6), followed by performing post-exposure baking at 110 to 140° C. for approximately 60 seconds.

The exposed resist layers were developed using a 2.38 wt % solution of tetramethylammonium hydroxide (TMAH) to form a resist pattern. The results showed that a 0.08 to 0.23 μm line-and-space pattern could be obtained at an exposure dose of approximately 5 to 50 mJ/cm$^2$. Since the exemplary photosensitive polymers according to the invention include a plurality of fluorine atoms, e.g., a pentafluoro-1-methyl vinyl monomer having five fluorine atoms, the resist compositions comprising the photosensitive polymer exhibit an improved transmittance at 157 nm when compared to conventional resists compositions.

Further, because the photosensitive polymers according to the invention have glass transition temperatures in the range of approximately 120 to 180° C., it is possible to achieve a sufficient elimination of free volume from the resist layers incorporating the photosensitive polymer during the baking step. Accordingly, the resist layer will tend to exhibit enhanced environmental resistance even after a post-exposure delay (PED). Therefore, exemplary embodiments of the photosensitive polymers of the invention exhibit improved lithography performance that will be advantageous for manufacturing the next generations of semiconductor devices.

Further, in the case where a deprotecting group, e.g., an alkoxy carbonyl group, is a substituent on the pentafluoro-1-methylvinyl, the resist composition containing the same can be chemically amplified to be subjected to acidolysis by acid ($H^+$), thereby increasing the solubility of the polymer to improve the contrast characteristics of the resist.

While this invention has been particularly shown and described, it will be understood by those skilled in the art that various changes in form and details may be made therein without departing from the spirit and scope of the invention as defined by the appended claims.

What is claimed is:

1. A photosensitive polymer comprising:
a polymerization product of
(a) a pentafluoromethylvinyl ether derivative monomer having the formula:

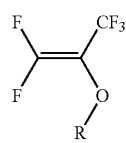

wherein R is selected from a group consisting of alkylsilane, fluorine-substituted or unsubstituted $C_3$–$C_{20}$ alkyl carbonyl, fluorine-substituted or unsubstituted $C_3$–$C_{20}$ cycloalkylcarbonyl or fluorine-substituted or unsubstituted benzoyl, and
(b) at least one additional monomer selected from the group consisting of fluorine-substituted (meth)acrylic acid monomer, fluorine-substituted (meth)acrylate monomer, fluorine-substituted styrene monomer, fluorine-substituted norbornene monomer, and fluorine-substituted maleic anhydride monomer.

2. The photosensitive polymer of claim 1, wherein R is alkylsilane, and the pentafluoromethylvinyl ether derivative monomer has the formula:

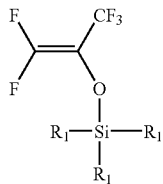

wherein $R_1$ is a fluorine-substituted or unsubstituted $C_1$–$C_{20}$ alkyl.

3. The photosensitive polymer of claim 1, wherein R is fluorine-substituted or unsubstituted $C_3$–$C_{20}$ cycloalkylcarbonyl, and the pentafluoromethylvinyl ether derivative monomer has the formula:

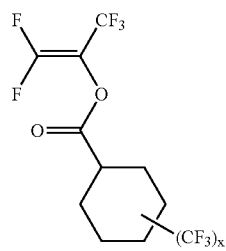

wherein x is 0, 1, 2 or 3.

4. The photosensitive polymer of claim 1, wherein R is fluorine-substituted or unsubstituted benzoyl, and the pentafluoromethylvinyl ether derivative monomer has the formula:

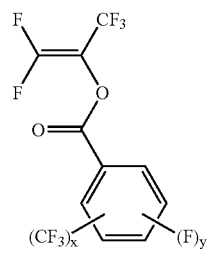

wherein x is 0, 1, 2 or 3; wherein y is 0, 1, 2 or 3; and further wherein x and y satisfy the expression $x+y<6$.

5. The photosensitive polymer of claim 1, wherein R is fluorine-substituted or unsubstituted $C_3$–$C_{20}$ alkylcarbonyl, and the pentafluoromethylvinyl ether derivative monomer has the formula:

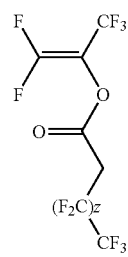

wherein z is a whole number that satisfies the expression $1 \leq z \leq 7$.

6. A resist composition comprising:
the photosensitive polymer according to claim 1 having a weight average molecular weight of between about 3,000 and 100,000; and
a photoacid generator (PAG).

7. The resist composition of claim 6, wherein the photoacid generator (PAG) represents about 1 to about 15 wt %, based on the weight of the photosensitive polymer.

8. The resist composition of claim 6, wherein the pentafluoromethylvinyl ether derivative monomer is represented by the formula:

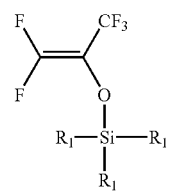

wherein $R_1$ is fluorine-substituted or unsubstituted $C_1$–$C_2$ alkyl.

9. The resist composition of claim 6, wherein the pentafluoromethylvinyl ether derivative monomer is represented by the formula:

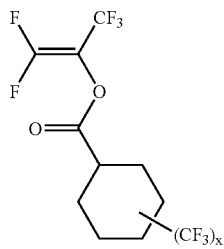

wherein x is 0, 1, 2 or 3.

10. The resist composition of claim 6, wherein the pentafluoromethylvinyl ether derivative monomer is represented by the formula:

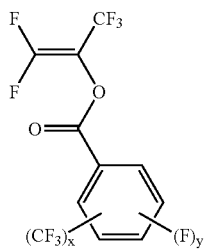

wherein x is 0, 1, 2 or 3; y is 0, 1, 2 or 3 and further wherein x and y satisfy the expression 0≦x+y 6.

11. The resist composition of claim 6, wherein the pentafluoromethylvinyl ether derivative monomer is represented by the formula:

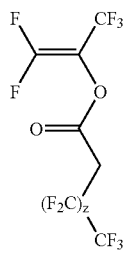

wherein z is whole number that satisfies the expression 1≦z≦7.

12. The resist composition of claim 6, wherein the PAG is selected from a group consisting of triarylsulfonium salts, diaryliodonium salts, sulfonates and mixtures thereof.

13. The resist composition of claim 6, further comprising an organic base.

14. The resist composition of claim 13, wherein the organic base includes at least one base selected from a group consisting of triethylamine, triisobutylamine, triisooctylamine, triisodecylamine, diethanolamine, triethanolamine and mixtures thereof.

15. The resist composition of claim 14, wherein the organic base is about 0.01 to about 2.0 wt % based on the weight of the photosensitive polymer.

16. A method of forming a fine photoresist pattern on a semiconductor substrate comprising:
coating the semiconductor substrate with a photoresist composition according to claim 6 to form a photoresist layer;
selectively exposing the photoresist layer using an exposure light source having a wavelength of not more than about 157 nm to form an exposed photoresist layer;
developing the exposed photoresist layer to form a photoresist pattern.

17. A method of forming a fine photoresist pattern on a semiconductor substrate according to claim 16, further comprising:
baking the photoresist layer at a temperature of up to 150° C.;
baking the exposed photoresist layer to promote acidolysis of the photosensitive polymer within exposed portions of the exposed photoresist layer and form a baked exposed photoresist layer; and
applying an aqueous solution of tetramethylammonium hydroxide (TMAH) to the baked exposed photoresist layer to develop the photoresist pattern.

18. A method of forming a fine photoresist pattern on a semiconductor substrate according to claim 17, wherein:
the photoresist pattern includes a minimum feature size of less than about 100 nm.

19. A method of forming a fine photoresist pattern on a semiconductor substrate according to claim 18, wherein:
the photoresist pattern includes a minimum feature size of less than about 80 nm.

20. A photosensitive polymer comprising pentafluoromethylvinyl ether derivative monomer units having the formula:

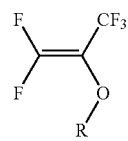

selected from a group consisting of monomer units wherein R is fluorine-substituted or unsubstituted $C_3$–$C_{20}$ cycloalkylcarbonyl having the formula:

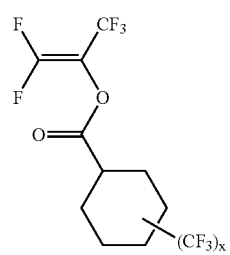

wherein x is 0, 1, 2 or 3,
monomer units in which R is fluorine-substituted or unsubstituted benzoyl having the formula:

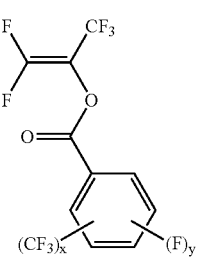

wherein x is 0, 1, 2 or 3, wherein y is 0, 1, 2 or 3, with x and y satisfying the expression x+y<6; and monomer units in which R is fluorine-substituted or unsubstituted $C_3$–$C_{20}$ alkylcarbonyl having the formula:

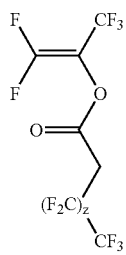

wherein z is a whole number that satisfies the expression $1 \leq z \leq 7$.

21. A resist composition comprising:
a photosensitive polymer having a weight average molecular weight of between about 3,000 and 100,000 that consists essentially of pentafluoromethylvinyl ether derivative monomer units according to claim 20; and
a photoacid generator (PAG).

22. A photosensitive polymer consisting essentially of pentafluoromethylvinyl ether derivative monomer units according to the formula:

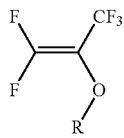

wherein R is selected from a group consisting of alkylsilane, fluorine-substituted or unsubstituted $C_3$–$C_{20}$ alkyl carbonyl, fluorine-substituted or unsubstituted C3–C20 cycloalkylcarbonyl or fluorine-substituted or unsubstituted benzoyl.

* * * * *